United States Patent [19]

Kohsiek

[11] Patent Number: 4,482,820

[45] Date of Patent: Nov. 13, 1984

[54] INTEGRATED CIRCUIT HAVING STRAY CAPACITANCE COMPENSATION

[75] Inventor: Cord H. Kohsiek, Hamburg, Fed. Rep. of Germany

[73] Assignee: U.S. Philips Corporation, New York, N.Y.

[21] Appl. No.: 378,568

[22] Filed: May 17, 1982

[30] Foreign Application Priority Data

May 30, 1981 [DE] Fed. Rep. of Germany ....... 3121671

[51] Int. Cl.³ .............................................. H03K 17/00
[52] U.S. Cl. .................................. 307/303; 330/292; 331/105; 174/52 FP
[58] Field of Search ............... 174/52 FP; 357/82, 74; 307/303; 330/292; 331/105

[56] References Cited

U.S. PATENT DOCUMENTS

| | | | |
|---|---|---|---|
| 3,528,021 | 9/1970 | Okasaki | 330/292 |
| 3,560,866 | 2/1971 | Haines | 330/292 |
| 3,909,637 | 9/1975 | Dorler | 307/303 |
| 4,023,053 | 5/1977 | Shimizu et al. | 307/303 |

FOREIGN PATENT DOCUMENTS 1930321 12/1970 Fed. Rep. of Germany.

Primary Examiner—Stanley D. Miller
Assistant Examiner—B. P. Davis
Attorney, Agent, or Firm—Robert T. Mayer; Steven R. Biren

[57] ABSTRACT

A circuit arrangement includes an integrated semiconductor circuit with a plurality of connection leads in which stray capacitances with equal temperature coefficients exist between one connection lead and the two adjacent, second and third, connection leads. A voltage is present between the first and second connection leads, and produces a current through the stray capacitance between these connection leads. In order to cancel the effect of this temperature-dependent current, a compensation voltage is applied between the first and second connection leads, which compensation voltage causes a current which is equal and opposite to the current through the stray capacitance between the first and second connection leads to flow through the stray capacitance between the first and third connection leads.

6 Claims, 4 Drawing Figures

INTEGRATED CIRCUIT HAVING STRAY CAPACITANCE COMPENSATION

BACKGROUND OF THE INVENTION

The invention relates to a circuit arrangement comprising an integrated semiconductor circuit, which circuit comprises a casing with a plurality of connection leads, stray capacitances with equal temperature coefficients existing between a first connection lead and the two adjacent, second and third, connection leads.

In an integrated semiconductor circuit, which is generally accommodated in a so-called "dual in-line" housing, stray capacitances arise between adjacent connection leads.

However, in many cases it is desirable to minimize the capacitance value or the temperature dependence of said stray capacitance between the connection leads of such an integrated semiconductor circuit. This is of particular importance for high-impedance signal processing circuits, resonant circuits, oscillators etc.

It may be possible to compensate for the temperature coefficient of the undesired stray capacitance by connecting an external capacitance having an opposite temperature coefficient to the integrated semiconductor circuit. However, as a result of this the overall capacitance increases and in many cases the field of application of the semiconductor circuit is restricted to an undesired extent.

It is known from GB-PS No. 12 41 285 to neutralize the undesired base-collector capacitance of a transistor in a transistor amplifier by means of an additional capacitance which is integrated in the semiconductor body of the transistor. However, it is not possible to compensate in this way for the stray capacitances between the connection leads of an integrated semiconductor circuit.

SUMMARY OF THE INVENTION

It is the object of the invention to construct a circuit arrangement of the type mentioned above in such a way that the stray capacitance between a first connection lead and a second connection lead is compensated for in a simple manner in such a way that the temperature coefficient of this stray capacitance no longer adversely affects the complete circuit arrangement comprising the integrated semiconductor circuit and its external complement.

According to the invention, this object is achieved in that a compensation voltage is applied between the first connection lead and the third connection lead, which voltage causes a current to flow through the stray capacitance between the first connection lead and the third connection lead, which current is equal and opposite to the current through the stray capacitance between the first connection lead and the second connection lead.

In accordance with a further embodiment of the invention, the compensation voltage is generated by a circuit which is integrated in the semiconductor circuit.

The principal advantage of the invention is that the capacitance between two connection leads of an integrated semiconductor circuit incorporated in a circuit arrangement can be compensated for in an effective and simple manner. In addition, it is readily possible to compensate for the corresponding stray capacitances of a holder for the integrated semiconductor circuit and the stray capacitances between the conductors to the connection leads on a printed circuit board carrying the integrated semiconductor circuit.

BRIEF DESCRIPTION OF THE DRAWING

Embodiments of the invention will now be described in more detail, by way of example, with reference to the accompanying drawings. In the drawings.

DESCRIPTION OF THE PREFERRED EMBODIMENTS

Figure 1:
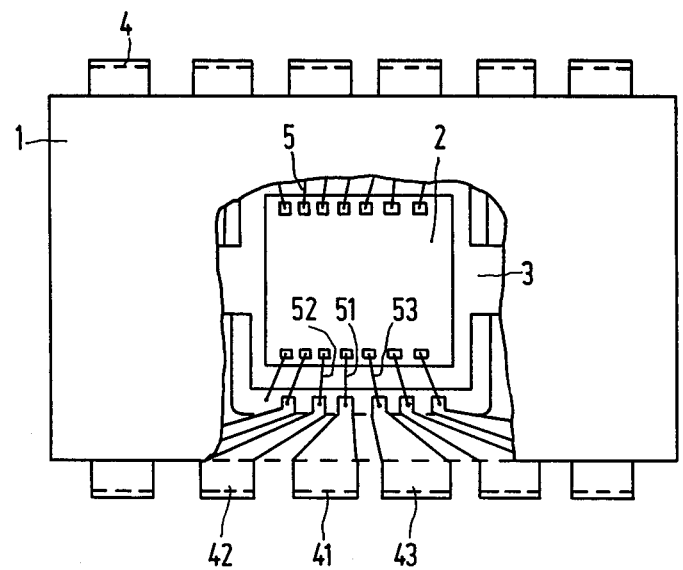
FIG. 1 shows an integrated semiconductor circuit with its connection leads which form stray capacitances.

FIG. 1 shows an integrated semiconductor circuit in which a semiconductor body 2 in a casing or housing 1 is mounted on a support 3 and is connected to the connection pins 4 of the integrated circuit via bonded wires 5.

Of the bonded wires 5 and the connection pins 4, which together constitute the connection leads, three leads, i.e. the bonded wires 51, 52 and 53 and the connection pins 41, 42 and 43 are shown in more detail.

Figure 2:
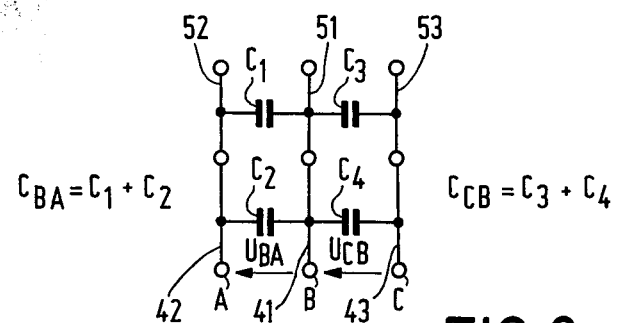
FIG. 2 shows the equivalent diagram of a part of the integrated circuit shown in FIG. 1 which forms a stray capacitance.

Stray capacitances, whose equivalent diagram is shown in FIG. 2, are formed between these adjacent connection leads. The connection lead A comprises the bonded wire 52 and the connection pin 42, the connection lead B the bonded wire 51 and the connection pin 41, and the connection lead C the bonded wire 53 and the connection pin 43. The stray capacitances formed between the bonded wires 51 and 52 on the one hand and 51 and 53 on the other hand are designated $C_1$ and $C_3$ respectively and the stray capacitances existing between the connection pins 41 and 42 on the one hand and 41 and 43 on the other hand are designated $C_2$ and $C_4$ respectively. Thus, a stray capacitance $C_{BA} = C_1 + C_2$ exists between the connection leads B and A and a stray capacitance $C_{CB} = C_3 + C_4$ exists between the connection leads B and C.

It is now assumed that B is the connection lead whose stray capacitance relative to the adjacent connection leads A and C, i.e. the stray capacitances $C_{BA}$ and $D_{CB}$, impairs the correct operation of a circuit arrangement comprising the integrated circuit. The alternating voltage across the connection leads B and A is $U_{BA} = U_O \sin \omega t$. The current flowing through the stray capacitance $C_{BA}$ is then $I_{BA} = j\omega C_{BA} U_O \sin \omega t$.

A corresponding current will then flow through the stray capacitance $C_{CB}$. In order to ensure that no capacitive current arises at connection lead B the opposite currents $I_{BA}$ and $I_{CB}$ should be equal, i.e. the two currents should have the same frequency, the same amplitude and the same phase. This requirement is met if the voltage $$U_{CB} = U_O(C_{BA}/C_{CB}) \sin \omega t = U_{BA}(C_{BA}/C_{CB})$$

is applied to the connecting lead C.

Since all stray capacitances have the same dielectric, which is determined by the materials of the integrated circuit casing, the quotient $$(C_{BA}/C_{CB}) = K$$

exhibits no temperature dependence. In order to generate the correct compensation voltage $U_{CB}$ it therefore suffices to know $U_{BA}$ and the value of K. However, said quotient K depends on the geometry of the integrated circuit, i.e. the geometry of the connection pins and the bonded wires.

In order to meet said requirement, that is, to cancel the effect of the stray capacitances, it suffices to generate the voltage $U_{CB} = K \cdot U_{BA}$ by means of a suitable circuit and to apply it to the connection lead C.

By a suitable choice of their ratios it is also possible to compensate for the effect of further stray capacitances formed in other parts of the circuit arrangement, which capacitances are connected to the first, second and third connection leads. Such further stray capacitances are, for example, the capacitances in a holder for the integrated circuit and the capacitances between the conductor tracks of a printed circuit board, which tracks are connected to the said connection leads.

Figure 3:
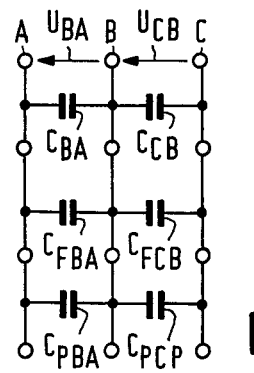
FIG. 3 shows the equivalent diagram of the stray capacitances of an integrated semiconductor circuit mounted on a p.c. board by means of a holder.

FIG. 3 shows the equivalent diagram of the stray capacitances of an integrated semiconductor circuit mounted on a printed circuit board by means of a holder.

In order to compensate for the stray capacitances of a holder for the integrated semiconductor circuit the quotient $$C_{FBA}/C_{FCB}$$

of the stray capacitances of the holder between the first connection lead B and the second connection lead A and the stray capacitance of the holder between the first connection lead B and the third connection lead C is selected so that it also has the value K. If the value K for the holder is given and cannot be changed, the value K for the casing of the integrated circuit may be selected accordingly. If the stray capacitance of a printed circuit board on which the integrated semiconductor circuit is mounted is also to be compensated for, the dimensions of the conductor tracks on said printed circuit board which lead to the said connection leads are selected so that the quotient $$C_{PBA}/C_{PCB}$$

of the mutual capacitance $C_{FBA}$ of the conductor tracks of the printed circuit board which are connected to the first connection lead B and the second connection lead A, and the mutual capacitance $C_{FCB}$ of the conductor tracks of the printed circuit board which are connected to the first connection lead C and the third connection lead D, also has the value K.

Figure 4:
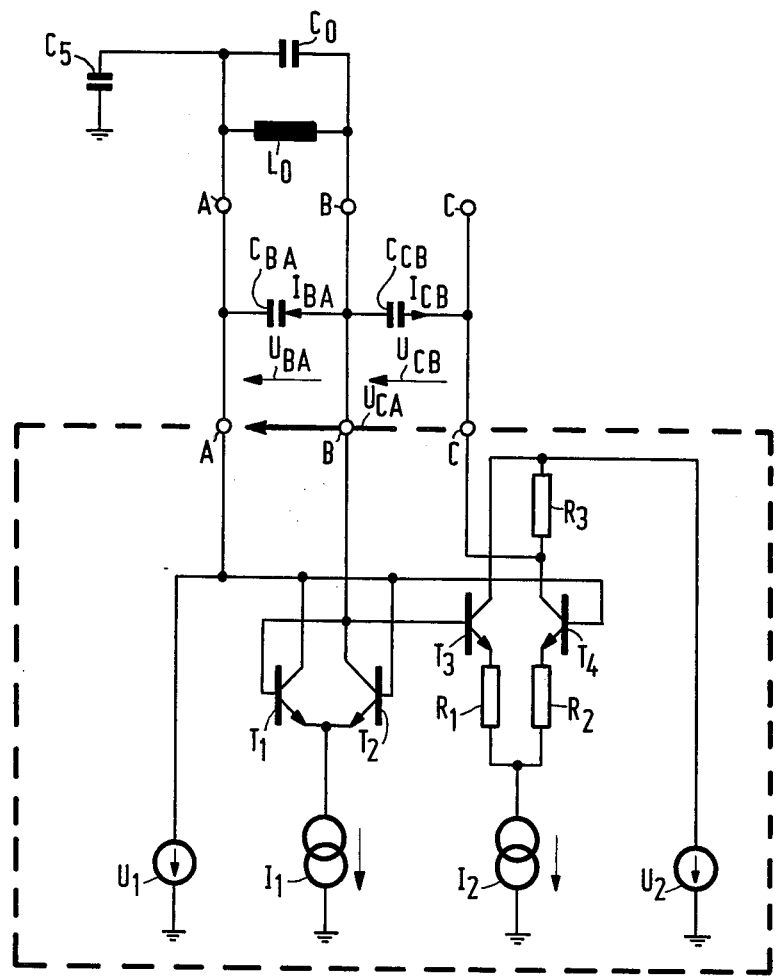
FIG. 4 shows the equivalent diagram of a circuit arrangement comprising an integrated semiconductor circuit, in which an oscillator circuit and a circuit for generating a compensation voltage are integrated.

FIG. 4 shows an embodiment of a circuit arrangement in accordance with the invention in which an LC-oscillator which in principle comprises the transistors $T_1$ and $T_2$ as well as the voltage source $U_1$ and the current source $I_1$ is integrated in the integrated circuit, the frequency-determining elements $C_O$ and $L_O$ of this oscillator being connected to the connection leads A and B as external circuit elements. Furthermore, the connection lead A is connected to ground via a capacitance $C_5$, so that the oscillator voltage is only present on the connection lead B. In this circuit arrangement the stray capacitance $C_{BA}$, whose temperature coefficient gives rise to temperature dependence of the oscillator frequency, is connected in parallel with the frequency-determining capacitance $C_O$. Said stray capacitance is compensated for in the manner described, in that a voltage $U_{CB}$ is applied to the third connection lead C, the amplitude of this voltage having been selected to equal $K \cdot U_{BA}$, where K is the quotient $$C_{BA}/C_{CB}$$

of the stray capacitances between the first and second connection leads and between the first and third connection leads respectively and $U_{BA} = U_O \sin \omega t$ is the voltage appearing on the output of the integrated part of the oscillator circuit between the first and second connection leads.

The currents through the stray capacitances $C_{BA}$ and $C_{CB}$ are then:

$$I_{BA} = U_{BA} \cdot j\omega C_{BA} \text{ and}$$

$$I_{CB} = U_{CB} \cdot j\omega C_{CB}.$$

If $K = C_{BA}/C_{CB}$ then $U_{CB} = K \cdot U_{BA}$ and $U_{CB} \cdot C_{CB} = U_{BA} \cdot C_{BA}$. The currents $I_{BA}$ and $I_{CB}$ are then equal and opposite at the connection lead B, so that no current which is caused by the capacitances $C_{BA}$ and $C_{CB}$ respectively and which is temperature-dependent as a function of these capacitances flows at this location. Thus, the oscillator frequency is only determined by $C_O$ and $L_O$ and is independent of the stray capacitances.

The compensation voltage $U_{CB}$ is generated by an auxiliary circuit which is integrated in the integrated circuit and which essentially comprises the transistors $T_3$ and $T_4$, the resistors $R_1$ to $R_3$, the voltage generator $U_2$ and the current generator $I_2$. In principle, this circuit forms a voltage amplifier which amplifies the output voltage $U_{BA}$, i.e. the oscillator voltage appearing on the base of transistor $T_3$, and applies it to the connection lead C.

What is claimed is:

1. A circuit arrangement comprising an integrated semiconductor circuit, which circuit comprises a housing with a plurality of connection leads, stray capacitances with equal temperature coefficients existing between a first connection lead and the two adjacent, second and third, connection leads, characterized in that for reducing the effect of the stray capacitances on the signal at the first connection lead means are provided for generating a compensation voltage and applying said voltage between the first and third connection leads for causing a current to flow through the stray capacitance between the first and third connection leads, which current is equal and opposite to the current through the stray capacitance between the first and second connection leads.

2. A circuit arrangement as claimed in claim 1, characterized in that the compensation voltage is generated by a circuit which is integrated in the semiconductor circuit.

3. A circuit arrangement as claimed in claim 1 or 2, characterized in that the amplitude of the compensation voltage ($U_{CB}$) is K times the amplitude of the voltage ($U_{BA}$) between the first (B) and second (A) connection leads, K being the value of the quotient $$(C_{BA}/C_{CB})$$

of the stray capacitance ($C_{BA}$) between the first (B) and second (A) connection leads and the stray capacitance ($C_{CB}$) between the first (B) and third (C) connection leads.

4. A circuit arrangement as claimed in claim 3, comprising a holder for the integrated semiconductor circuit, characterized in that the quotient ($C_{FBA}/C_{FCB}$)

of the stray capacitance of the holder between the first (B) and second (A) connection leads and the stray capacitance of the holder between the first (B) and third (C) connection leads has the value K.

5. A circuit arrangement as claimed in claim 3, comprising a printed circuit board on which the integrated semiconductor circuit is mounted, characterized in that the quotient ($C_{PBA}/C_{PCB}$)

of the mutual capacitance ($C_{FBA}$) of the conductor tracks of the printed circuit board which are connected to the first (B) and second (A) connection leads and the mutual capacitance ($C_{FCB}$) of the conductor tracks of the printed board which are connected to the first (B) and third (C) connection leads has the value K.

6. A circuit arrangement as claimed in claim 1 or 2, further comprising an oscillator circuit, characterized in that the oscillator circuit, except for a frequency-determining resonant circuit, is integrated in the semiconductor circuit and the frequency-determining resonant circuit ($C_O$, $L_O$) is connected between the first (B) and second (A) connection leads.

* * * * *